US010403696B2

(12) United States Patent
Nam et al.

(10) Patent No.: US 10,403,696 B2
(45) Date of Patent: Sep. 3, 2019

(54) ORGANIC LIGHT EMITTING DISPLAY DEVICE AND METHOD OF FABRICATING THE SAME

(71) Applicant: LG Display Co., Ltd., Seoul (KR)

(72) Inventors: Kyoung-Jin Nam, Paju-si (KR); Jeong-Oh Kim, Goyang-si (KR); Yong-Min Kim, Anyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/106,828

(22) Filed: Aug. 21, 2018

(65) Prior Publication Data

US 2018/0358420 A1 Dec. 13, 2018

Related U.S. Application Data

(62) Division of application No. 15/378,511, filed on Dec. 14, 2016, now Pat. No. 10,084,026.

(30) Foreign Application Priority Data

Dec. 29, 2015 (KR) ........................ 10-2015-0188445

(51) Int. Cl.
*H01L 27/32* (2006.01)
*H01L 51/00* (2006.01)
(Continued)

(52) U.S. Cl.
CPC .......... *H01L 27/3246* (2013.01); *H01L 27/12* (2013.01); *H01L 27/322* (2013.01); *H01L 27/326* (2013.01); *H01L 27/3248* (2013.01); *H01L 27/3258* (2013.01); *H01L 27/3262* (2013.01); *H01L 27/3272* (2013.01); *H01L 27/3276* (2013.01); *H01L 51/0023* (2013.01); *H01L 51/5203* (2013.01); *H01L 51/56* (2013.01); *H01L 2227/323* (2013.01)

(58) Field of Classification Search
None
See application file for complete search history.

(56) References Cited

U.S. PATENT DOCUMENTS

2011/0031496 A1 2/2011 Yamazaki et al.
2014/0159026 A1 6/2014 Okumoto
(Continued)

FOREIGN PATENT DOCUMENTS

CN 103000662 A 3/2013
CN 104241325 A 12/2014
(Continued)

*Primary Examiner* — Michelle Mandala
(74) *Attorney, Agent, or Firm* — Dentons US LLP

(57) ABSTRACT

Disclosed are an organic light emitting display device improving opening ratio and a method of fabricating the same. The organic light emitting display device includes a light emitting device disposed at each sub-pixel of a substrate, a pixel circuit driving the light emitting device, a bank providing a first light emitting region at a remaining region except for a region where the pixel circuit is disposed, and a second light emitting region at the region where the pixel circuit is disposed, and a color filter disposed at the first and second light emitting regions, wherein at least one of electrodes included in the pixel circuit includes a transparent conductive layer at the second light emitting region.

4 Claims, 10 Drawing Sheets

(51) Int. Cl.

| | |
|---|---|
| ***H01L 51/52*** | (2006.01) |
| ***H01L 51/56*** | (2006.01) |
| ***H01L 27/12*** | (2006.01) |

(56) References Cited

U.S. PATENT DOCUMENTS

| | | | | |
|---|---|---|---|---|
| 2015/0060814 | A1* | 3/2015 | Noh | H01L 27/3272 257/40 |
| 2015/0060832 | A1 | 3/2015 | Ito et al. | |
| 2015/0200212 | A1 | 7/2015 | Xun et al. | |

FOREIGN PATENT DOCUMENTS

| | | | |
|---|---|---|---|
| CN | 104518001 | A | 4/2015 |
| CN | 104779254 | A | 7/2015 |
| EP | 2 618 378 | A2 | 7/2013 |
| EP | 2 744 007 | A1 | 6/2014 |
| EP | 2 816 627 | A1 | 12/2014 |
| EP | 2 854 179 | A2 | 4/2015 |
| TW | 201125115 | A | 7/2011 |
| TW | 201332100 | A | 8/2013 |

* cited by examiner

ORGANIC LIGHT EMITTING DISPLAY DEVICE AND METHOD OF FABRICATING THE SAME

This application is a Divisional of application Ser. No. 15/378,511 filed on Dec. 14, 2016, and claims priority to and the benefit of Korean Patent Application No. 10-2015-0188445 filed on Dec. 29, 2015, which is hereby incorporated by reference as if fully set forth herein.

BACKGROUND OF THE INVENTION

Field of the Invention

The present invention relates to an organic light emitting display device and a method of fabricating the same, and more particularly, to an organic light emitting display device with improved opening ratio and a method of fabricating the same.

Discussion of the Related Art

A display device displaying various information on a screen is a core technology of the information technology age. Display devices are developed to become thin, light, portable and high-performance. To this end, flat display devices, such as organic light emitting display devices, which control an amount of light emitted from an organic light emitting layer to display an image, have been spotlighted, since their weight and volume are reduced compared to cathode ray tubes (CRTs).

Organic light emitting diode (OLED) devices are a self-light emitting device and have various advantages, such as low power consumption, fast response time, high luminous efficiency, high luminance and wide viewing angle.

An organic light emitting display device typically include a plurality of pixels arranged in a matrix to display an image. Herein, each pixel includes a light emitting device and a pixel circuit including a plurality of transistors, which independently drive the light emitting device. In such an organic light emitting display device, when the light generated from the organic light emitting device is emitted to a bottom of a substrate, a plurality of electrode layers included in the pixel circuit are formed of an opaque material at a region where the pixel circuit is disposed, such that the light generated from the organic light emitting device may not be radiated.

Accordingly, a conventional organic light emitting display device has an opening ratio reduced by a region occupied by the pixel circuit. Furthermore, since a compensating circuit is also recently provided in each sub-pixel, it may be difficult to secure high opening ratio.

SUMMARY

Accordingly, the present invention is directed to a an organic light emitting display device and a method of manufacturing the same that substantially obviate one or more problems due to limitations and disadvantages of the related art.

An advantage of the present invention is to provide an organic light emitting display device with improved opening ratio and a method of fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic light emitting display device having a plurality of sub-pixels may, for example, include a light emitting device in each sub-pixel of a substrate; a pixel circuit that drives the light emitting device; a bank that provides a first light emitting region where the pixel circuit is not disposed and a second light emitting region where the pixel circuit is disposed; and a color filter in the first and second light emitting regions, wherein at least one of electrodes included in the pixel circuit includes a transparent conductive layer in the second light emitting region.

In another aspect, an organic light emitting display device may, for example, include a bank providing a first light emitting region at a remaining region except for a region where the pixel circuit is disposed, and a second light emitting region at the region where the pixel circuit is disposed. The organic light emitting display device includes a color filter and a light emitting device provided at the first and second light emitting regions. At least one of electrodes included in a pixel circuit includes a transparent conductive layer at the second light emitting region, thereby improving opening ratio.

In yet another aspect, a method of fabricating an organic light emitting display device having a plurality of sub-pixels may, for example, include forming a pixel circuit at each sub-pixel region of a substrate; forming a color filter on the substrate where the pixel circuit is formed; forming an anode electrode of a light emitting device connected to the pixel circuit; forming a bank to define a first emitting light area where the pixel circuit is not disposed and a second emitting light area where the pixel circuit is disposed; and forming an organic light emitting layer and a cathode electrode of the light emitting device in the first and second light emitting regions, wherein at least one of electrodes in the pixel circuit includes a transparent conductive layer in the second light emitting region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the invention, examples of which are illustrated in the accompanying drawings.

Figure 1:
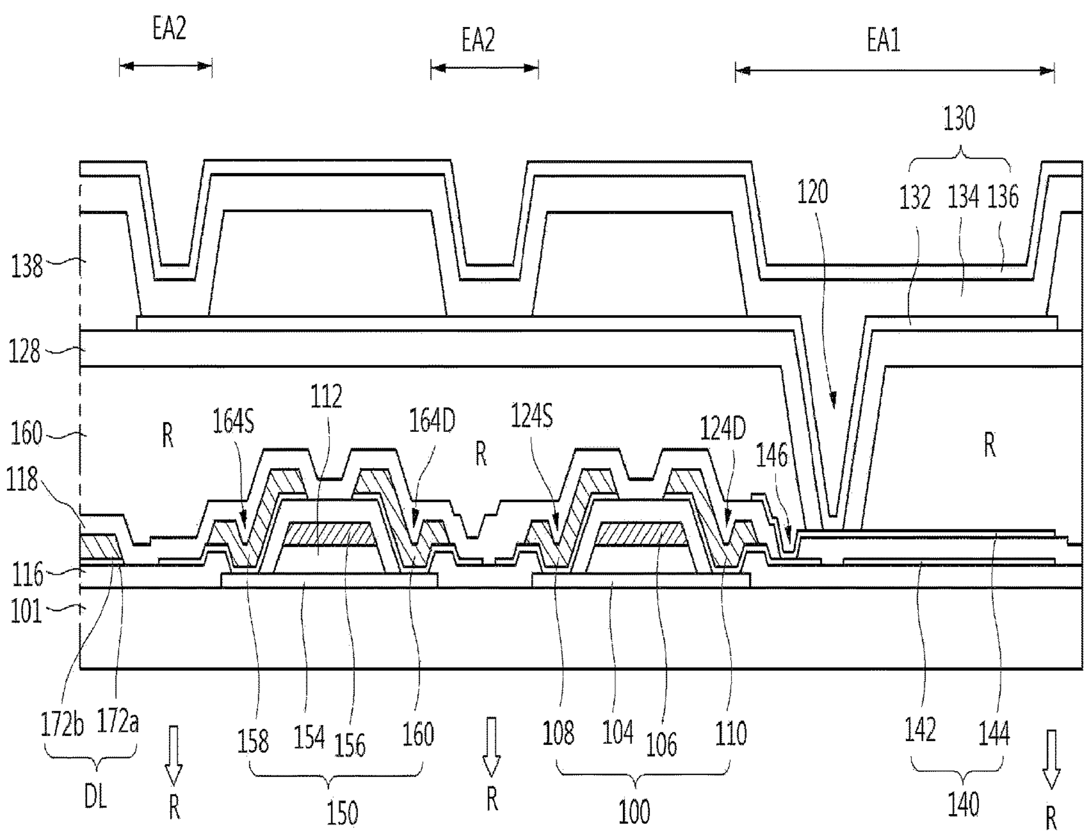
FIG. 1 is a cross-sectional view illustrating an organic light emitting display device according to an embodiment of the present invention.

FIG. 1 is a cross-sectional view illustrating an organic light emitting display device according to an embodiment of the present invention.

As illustrated in FIG. 1, each of red, green and blue sub-pixels of the organic light emitting display device includes a light emitting device, includes a light emitting device 130, and a pixel circuit, which independently drives the light emitting device 130. The pixel circuit includes a switching thin film transistor 150, a driving thin film transistor 100, and a storage capacitor 140.

The switching thin film transistor 150 supplies a data voltage from a data line DL to a second gate electrode 160 of the driving thin film transistor 100 based on a scan signal of a scan line (not shown). The switching thin film transistor 150 includes a first gate electrode 156 connected to the scan line, a first source electrode 158 connected to the data line DL, a first drain electrode 160 connected to a second gate electrode 106, and a first active layer 154.

The driving thin film transistor 150 controls a current supplied from a high voltage line (VDDL in FIG. 2) based on a driving voltage charged at the storage capacitor 140 to supply the current proportional to the driving voltage such that the light emitting device 130 is driven. The driving thin film transistor 100 includes the second gate electrode 106 connected to the first drain electrode 160, a second source electrode 108 connected to the high voltage line, a second drain electrode 110 connected to the light emitting device 130, and a second active layer 104.

The first and second gate electrodes 156 and 106 of the switching thin film transistor 150 and the driving thin film transistor 100 overlap a first oxide semiconductor layer 154 and a second oxide semiconductor layer 104, respectively, while gate insulating patterns 112, which are the same patterns as the first and second gate electrodes 156 and 106, are interposed between the first and second gate electrodes 153 and 106 and the first and second active layers 104 and 154. Each of the first and second gate electrodes 156 and 106 may have a single layer or multilayer form including at least one selected from the group consisting of molybdenum (Mo), aluminum (Al), chrome (Cr), gold (Au), titanium (Ti), nickel (Ni), neodymium (Nd), copper (Cu), or an alloy thereof, without being limited thereto.

The first and second active layers 154 and 104 are formed on the gate insulating patterns 112 to overlap the first and second gate electrodes 156 and 106, respectively. Thereby, channels are formed between the first source electrode 158 and the first drain electrode 160, and between the second source electrode 108 and the second drain electrode 110. Each of first and second active layers 154 and 104 is formed of a metallic oxide including at least one selected from the group consisting of Zn, Cd, Ga, In, Sn, Hf, and Zr, or is formed of polycrystalline silicon or amorphous silicon.

The first electrode 158 is connected to the first active layer 154 via a first source contact hole 164S, which passes through an interlayer insulating layer 116. The second electrode 108 is connected to the second active layer 105 via a second source contact hole 124S, which passes through the interlayer insulating layer 116. The first drain electrode 160 is connected to the first oxide semiconductor layer 154 via a first drain contact hole 164D, which passes through the interlayer insulating layer 116. The second drain electrode 110 is connected to the second oxide semiconductor layer 104 via a second drain contact hole 124D, which passes through the interlayer insulating layer 116

The first drain electrode is electrically connected to the first electrode 156 of the driving thin film transistor 100 via a connection electrode (not shown).

The second drain electrode 110 is connected to a storage upper electrode 144 exposed by a storage contact hole 146, which passes through a protective layer 118. The storage upper electrode 144 is connected to an anode electrode 132 exposed by a pixel contact hole 120, which passes through a planarization layer 128.

The storage capacitor 140 is disposed at the first light emitting region EA1. The storage capacitor 140 includes a storage lower electrode 142 and the storage upper electrode 144, while the protective layer 118 is interposed between the storage lower electrode 142 and the storage upper electrode 144. Herein, the storage lower electrode 142 is electrically connected to the first drain electrode 160 of the switching thin film transistor 150. The storage lower electrode 142 is formed of a transparent conductive material on the interlayer insulating layer 116. The storage upper electrode 144 is electrically connected to the second drain electrode 110 of the driving thin film transistor 160. The storage upper electrode 142 is formed of a transparent conductive material on the protective layer 118. Thus, the storage lower electrode 142 and the storage upper electrode 144, which constitute the storage capacitor and are formed of the transparent conductive material, are disposed at a first light emitting region EA1, such that decrease of opening ratio due to the storage capacitor 140 may be prevented.

The light emitting device 130 includes the anode electrode 132, an organic light emitting layer 134 formed on the anode electrode 132, and a cathode electrode 136 formed on the organic light emitting layer 134.

The anode electrode 132 is connected to the storage upper electrode 144 exposed by the pixel contact hole 120, which passes through the planarization layer 148, such that the anode electrode 132 is electrically connected to the second drain electrode 110 via the storage upper electrode 144. Meanwhile, when a bottom emission type organic light emitting display device is provided, the anode electrode 132 is formed of a transparent conductive oxide (TCO).

The anode electrode 132 is formed to overlap the switching thin film transistor 150 and the driving thin film transistor 100 such that the anode electrode 132 is disposed at a second light emitting region EA2. The anode electrode 132 overlaps the switching thin film transistor 150 and the driving thin film transistor 100 while the protective layer 118, a color filter 160, and the planarization layer 128 are interposed between the anode electrode 132, and the switching thin film transistor 150 and the driving thin film transistor 100. Herein, a distance between each of the switching thin film transistor 150 and the driving thin film transistor 100 and the anode electrode 132 corresponds to a thickness of the color filter 160, thereby preventing increase of parasitic capacitance.

The organic light emitting layer 134 is formed on the anode electrode 132 of the first and second light emitting regions EA1 and EA2, which are exposed by a bank 138. The organic light emitting layer 134 includes a hole-related layer, the light emitting layer, and an electron-related layer, which are stacked on the anode electrode 132 in order or in reverse order.

Figure 2:
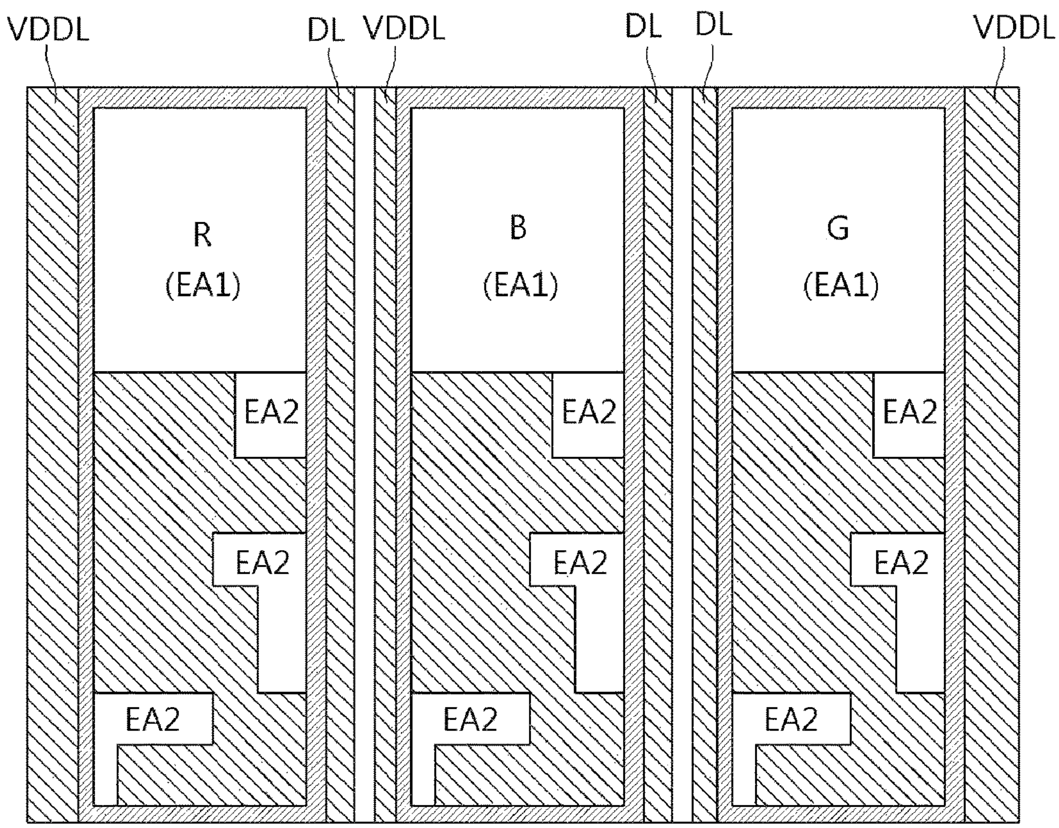
FIG. 2 is a view illustrating first and second light emitting regions illustrated in FIG. 1.

As illustrated in FIG. 2, the bank 138 is formed on the anode electrode 132 to prepare the first and second light emitting regions EA1 and EA2. The bank 138 exposes the anode electrode 132 disposed at the first and second light emitting regions EA1 and EA2. In each sub-pixel, the first light emitting region EA1 is provided at a region, at which the switching thin film transistor 150 and the driving thin film transistor 100 are not formed. In each sub-pixel, plural second light emitting regions EA2 are provided at a region, at which the switching thin film transistor 150 and the driving thin film transistor 100 are formed.

The cathode electrode 136 is formed at an upper surface and a side surface of the bank 138 in order to face the anode electrode 132 of the first and second light emitting regions EA1 and EA2 while the organic light emitting layer 134 is interposed between the cathode electrode 136 and the anode electrode 132. When a bottom emission type organic light emitting display device is provided, the cathode electrode 136 is formed to have a stacked structure including a transparent conductive layer, such as an indium-tin-oxide (ITO) or an indium-zinc-oxide (IZO), and a metallic layer, such as aluminum (Al), silver (Ag), and Ag:Pb:Cu (APC).

The first and second source electrodes 158 and 108, and the first and second drain electrodes 160 and 110 include transparent conductive layers 172*a* and opaque conductive layer 172*bs* formed on the transparent conductive layers 172*a*. Each of the transparent conductive layers 172*a* may be formed of a transparent conductive material such as ITO. Each of the opaque conductive layers 172*b* may have a single layer or multilayer form including at least one selected from the group consisting of molybdenum (Mo), aluminum (Al), chrome (Cr), gold (Au), titanium (Ti), nickel (Ni), neodymium (Nd), and copper (Cu) or an alloy thereof, without being limited thereto.

Particularly, the first and second source electrodes 158 and 108, and the first and second drain electrodes 160 and 110 are disposed to have a structure, in which the transparent conductive layer 172*a* and the opaque conductive layer 172*b* are stacked, at a remaining region of the pixel circuit except for the second light emitting region EA2. In this case, the first and second source electrodes 158 and 108, and the first and second drain electrodes 160 and 110 are disposed to have a structure, in which the transparent conductive layer 172*a* and the opaque conductive layer 172*b* are stacked, at a region overlapping the first and second active layers 154 and 104. The opaque conductive layer 172*b* blocks light generated from the light emitting device 130, thereby preventing the first and second active layers 154 and 104 from becoming conductive due to light from the light emitting device 130. Furthermore, the opaque conductive layer 172*b* having a high conductivity may prevent increases of resistive elements of the first and second source electrodes 158 and 108, and the first and second drain electrodes 160 and 110.

The first and second source electrodes 158 and 108, and the first and second drain electrodes 160 and 110 include the transparent conductive layer 172*a* at the first and second light emitting regions EA1 and EA2. Particularly, the first and second source electrodes 158 and 108, and the first and second drain electrodes 160 and 110 include the transparent conductive layer 172*a* at a non-overlapping area of the first and second active layers 154 and 104.

Herein, light passing through the color filter 160 at the second light emitting region EA2, at which the switching thin film transistor 150 and the driving thin film transistor 100 are disposed, is emitted to a bottom of a substrate 101 via the transparent conductive layers 172*a* of the first and second source electrodes 158 and 108, and the first and second drain electrodes 160 and 110. Accordingly, light is emitted from the second light emitting region EA2 as well as the first light emitting region EA1, such that opening ratio may be improved and thus, it may be easy to realize a high-resolution.

Furthermore, the electrodes corresponding to the contact holes disposed at the pixel circuit include the transparent conductive layers 172*a*. For example, the storage upper electrode 144 and the second drain electrode 110 overlapping the storage contact hole 146 includes the transparent conductive layer 172*a*, such that light is emitted from an area corresponding to the storage contact hole 146, thereby increasing opening ratio. Besides, the electrodes disposed at regions corresponding to the contact holes provided for connecting the first drain electrode 160 to the second gate electrode 106 include the transparent conductive layers 172*a*.

Table 1 illustrates opening ratio of an example, in which light is emitted at the first and second light emitting regions EA1 and EA2, and a comparative example, in which light is emitted at the first light emitting region EA1. It shows that the red and green sub-pixels of the example improve opening ratio of over 17% in comparison with the red and green sub-pixels of the comparative example. It shows that the blue sub-pixel of the example improves opening ratio of over 21% in comparison with the blue sub-pixel of the comparative example.

TABLE 1

| Opening ratio | Red sub-pixel | Green sub-pixel | Blue sub-pixel |
|---|---|---|---|
| Comparative example | 22.43% (4357.08 $\mu m^2$) | 22.43% (4357.08 $\mu m^2$) | 29.52% (5809.44 $\mu m^2$) |
| Example | 25.94% (5106.26 $\mu m^2$) | 25.81% (5080.83 $\mu m^2$) | 35.56% (7001.86 $\mu m^2$) |

FIGS. 3A to 3J are cross-sectional views illustrating a method of fabricating the organic light emitting display device illustrated in FIG. 1.

Figure 3A:
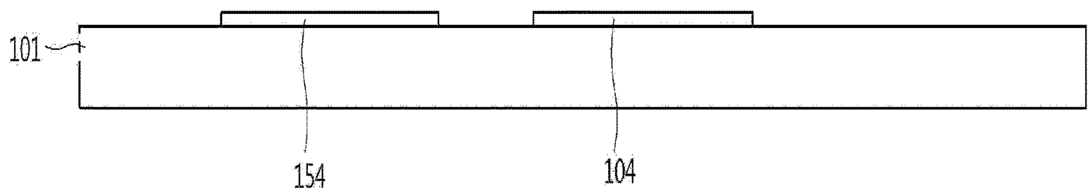
FIGS. 3A to 3J are cross-sectional views illustrating a method of fabricating the organic light emitting display device illustrated in FIG. 1.

Referring to FIG. 3A, the first and second active layers 154 and 104 are formed on the substrate 101.

In detail, after a semiconductor material is deposited on the substrate 101, the semiconductor material is etched by a photolithography process and an etching process to form the first and second active layers 154 and 104.

Figure 3B:
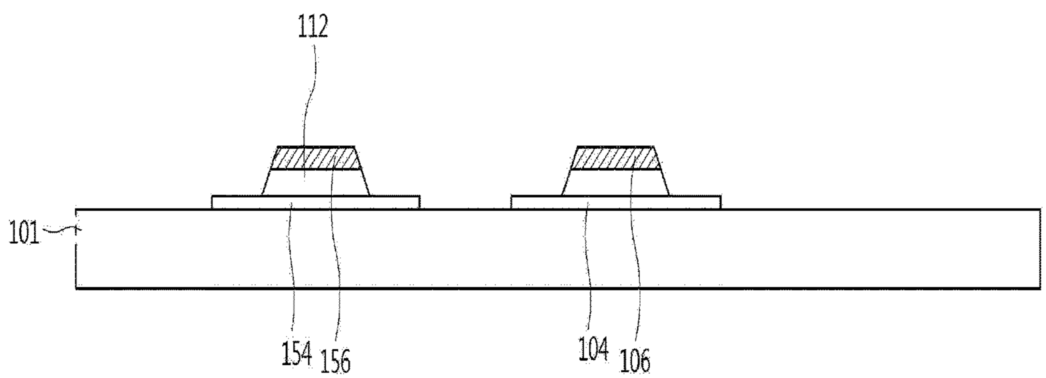

Referring to FIG. 3B, the first and second gate electrodes 156 and 106 and the gate insulating patterns 112, which have identical patterns, are formed on the substrate 101 where the first and second active layers 154 and 104 are formed.

In detail, a gate insulating layer is formed on the substrate 101 where the first and second active layers 154 and 104 are formed. A gate metallic layer is formed on the gate insulating layer using a deposition method such as a sputtering process. The gate insulating layer is formed of an inorganic insulating material such as SiOx and SiNx. The gate metallic layer is formed of a single layer or multilayer form including Mo, Ti, Cu, AlNd, Al, Cr or an alloy thereof. Then, the gate metallic layer and the gate insulating layer are simultaneously patterned by a photolithography process and an etching process to form the first and second gate electrodes 156 and 106 and the gate insulating patterns 112, which have identical patterns.

Figure 3C:
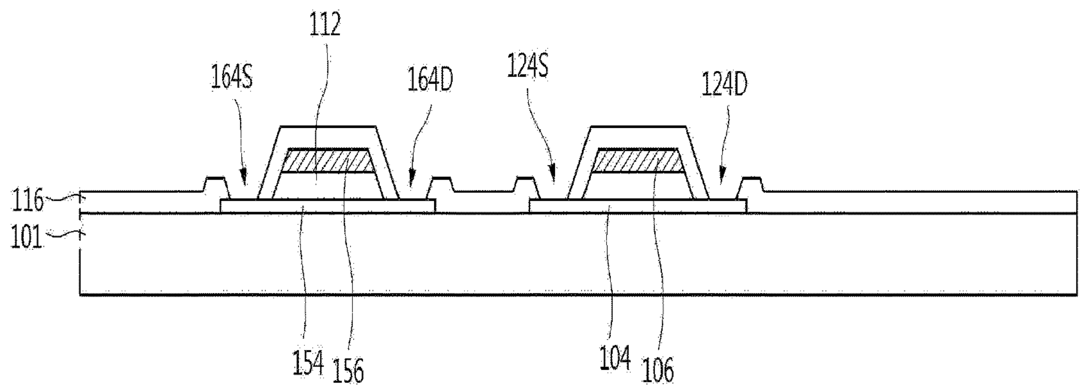

Referring to FIG. 3C, the interlayer insulating layer 116 having the first and second source contact holes 164S and 124S and the first and second drain contact holes 164D and 124D is formed on the substrate 101 where the first and second gate electrodes 156 and 106 are formed.

In detail, the interlayer insulating layer 116 is formed on the substrate 101, where the first and second gate electrodes 156 and 106 are formed, by a deposition method such as a plasma-enhanced chemical vapor deposition (PECVD). Then, the interlayer insulating layer 116 is patterned by a photolithography process and an etching process to form the first and second source contact holes 164S and 124S and the first and second drain contact holes 164D and 124D.

Figure 3D:
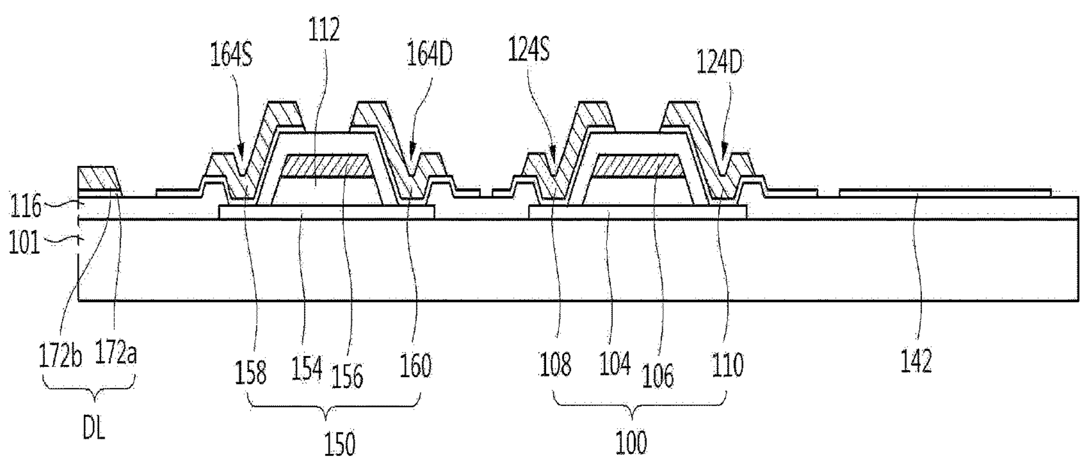

Referring to FIG. 3D, the first and second source electrodes 158 and 108, the first and second drain electrodes 160 and 110, and the storage lower electrode 142 are formed on the interlayer insulating layer 116 having the first and second source contact holes 164S and 124S and the first and second drain contact holes 164D and 124D. Hereinafter, forming the first and second source electrodes 158 and 108, the first and second drain electrodes 160 and 110, and the storage lower electrode 142 will be described in detail with reference to FIGS. 4A to 4D.

Figure 4A:
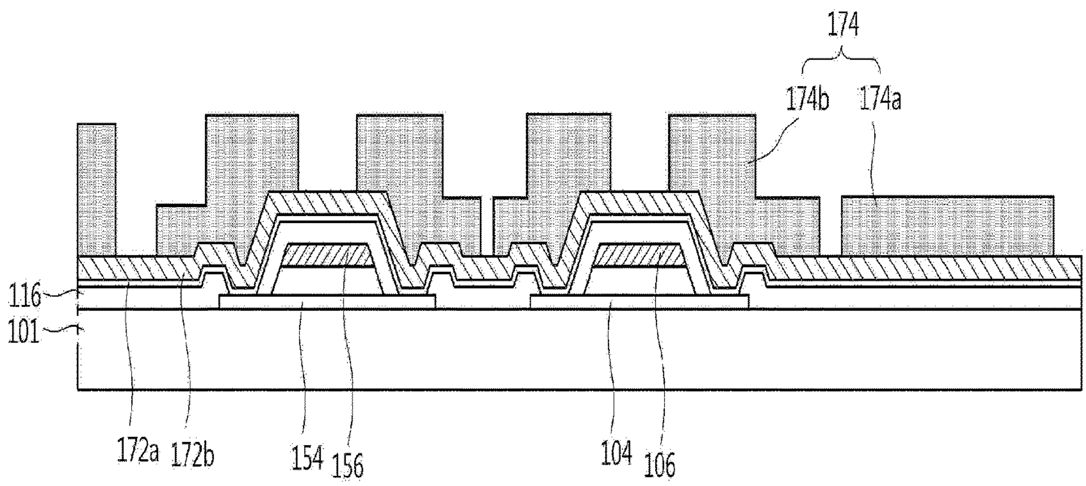
FIGS. 4A to 4D are views illustrating a method of fabricating first and second source electrodes, first and second drain electrodes, a data line, and a storage lower electrode illustrated in FIG. 3D in detail.
Figure 4B:
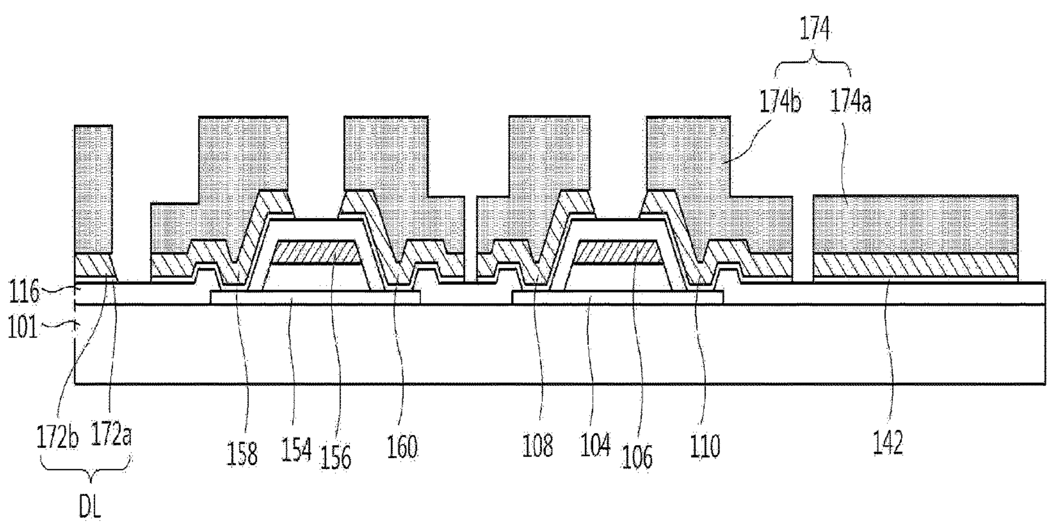
Figure 4C:
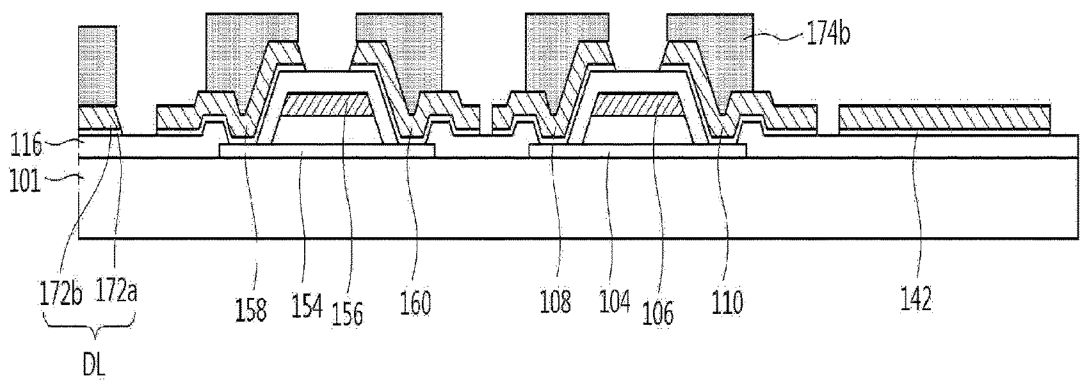
Figure 4D:
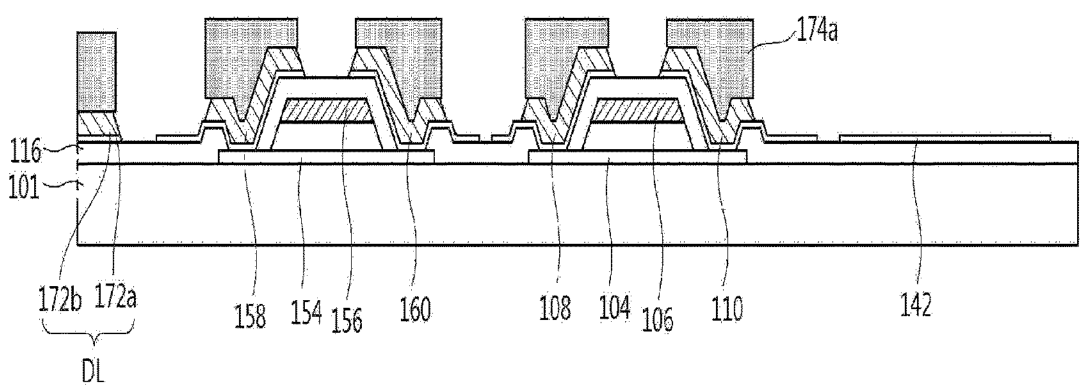

As illustrated in FIG. 4A, the transparent conductive layer 172*a* and the opaque conductive layer 172*b* are sequentially stacked on the interlayer insulating layer 116 having the first and second source contact holes 164S and 124S and the first and second drain contact holes 164D and 124D by a deposition method such as a sputtering process. Then, after a photoresist material is coated on the opaque conductive layer 172*b*, the photoresist material is exposed and developed using a halftone mask to form a photoresist pattern 174 having a multi-step structure. The photoresist pattern 174 having the multi-step structure includes a first photoresist pattern 174*a* having a first thickness and a second photoresist pattern 174*b* having a second thickness which is greater than the first thickness. The transparent conductive layer 172*a* and the opaque conductive layer 172*b* are etched using the photoresist pattern 174 having the multi-step structure as a mask to form the data line DL, the first and second source electrodes 158 and 108, the first and second drain electrodes 160 and 110, and the storage lower electrode 142, respectively, as illustrated in FIG. 4B. Herein, the transparent conductive layer 172*a* and the opaque conductive layer 172*b* of each of the data line DL, the first and second source electrodes 158 and 108, the first and second drain electrodes 160 and 110, and the storage lower electrode 142 are formed to have identical patterns. Subsequently, as illustrated in FIG. 4C, the photoresist pattern 174 having the multi-step structure is ashed and the first photoresist pattern 174*a* is removed and the thickness of second photoresist pattern 174*b* is lowered. Then, the opaque conductive layer 172*b* exposed by the second photoresist pattern 174*b* is etched using the second photoresist pattern 174*b* having the lowered thickness due to the ashing process as a mask. Accordingly, the first and second source electrodes 158 and 108 and the first and second drain electrodes 160 and 110 include the transparent conductive layers 172*a* at the second light emitting region EA2 of the pixel circuit. The first and second source electrodes 158 and 108 and the first and second drain electrodes 160 and 110 include the transparent conductive layers 172*a* and the opaque conductive layers 172*b* at remaining areas except for the second light emitting region EA2 of the pixel circuit. The storage lower electrode 142 includes the transparent conductive layer 172*a* at the first light emitting region EA1.

Figure 3E:
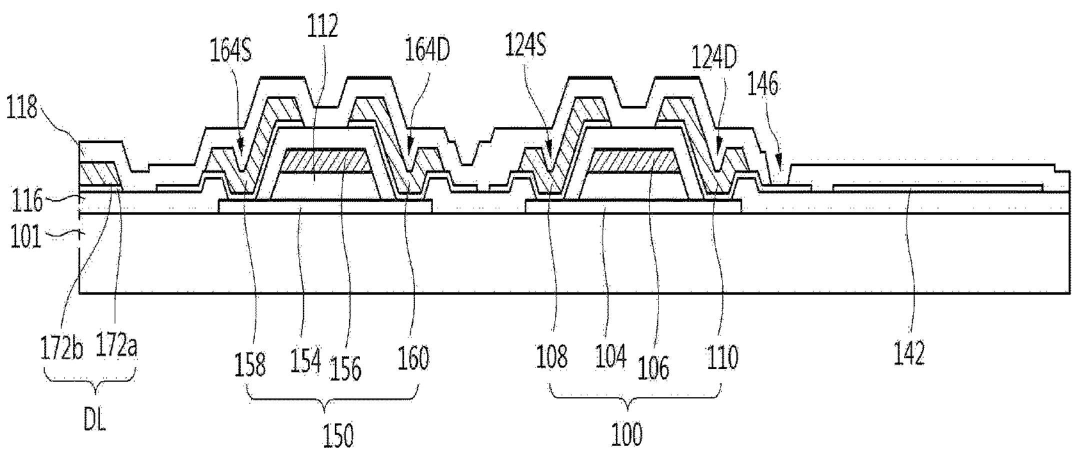

Referring to FIG. 3E, the protective layer 118 having the storage contact hole 146 is formed on the interlayer insulating layer 116 where the first and second source electrodes

158 and 108, the first and second drain electrodes 160 and 110, and the storage lower electrode 142 are formed.

In detail, the protective layer 118 is formed on the interlayer insulating layer 116 where the first and second source electrodes 158 and 108, the first and second drain electrodes 160 and 110, and the storage lower electrode 142 are formed. The protective layer 118 is formed of an inorganic insulating layer such as SiOx and SiNx. Then, the protective layer 118 is patterned by a photolithography process and an etching process to form the storage contact hole 146.

Figure 3F:
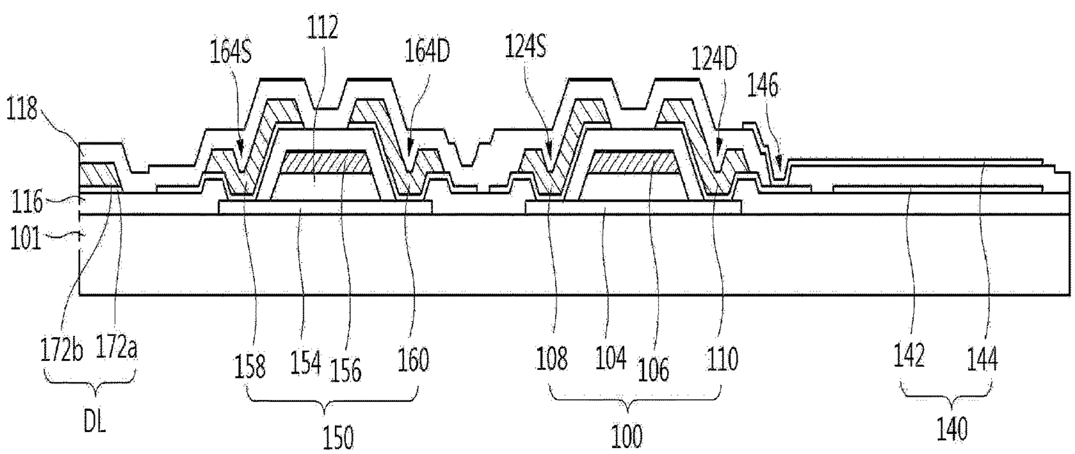

Referring to FIG. 3F, the storage upper electrode 144 is formed on the protective layer 118 having the storage contact hole 146.

In detail, a transparent conductive layer is deposited on the protective layer 118 having the storage contact hole 146. Subsequently, the transparent conductive layer is patterned by a photolithography process and an etching process to form the storage upper electrode 144.

Figure 3G:
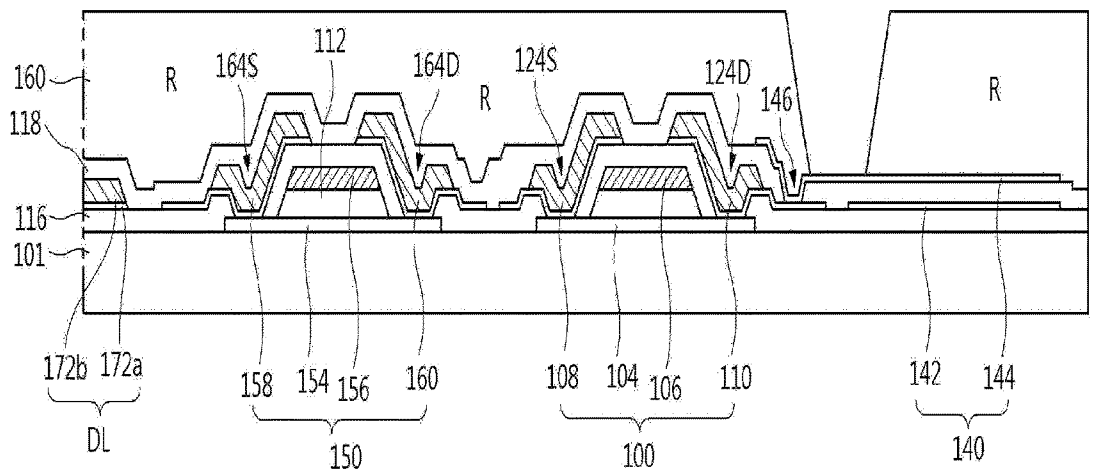

Referring to FIG. 3G, the color filter 160 is formed on the substrate 101 where the storage upper electrode 144 is formed.

In detail, after a color resin is deposited on the substrate 101 where the storage upper electrode 144 is formed, the color resin is patterned by a photolithography process to form the color filter 160.

Figure 3H:
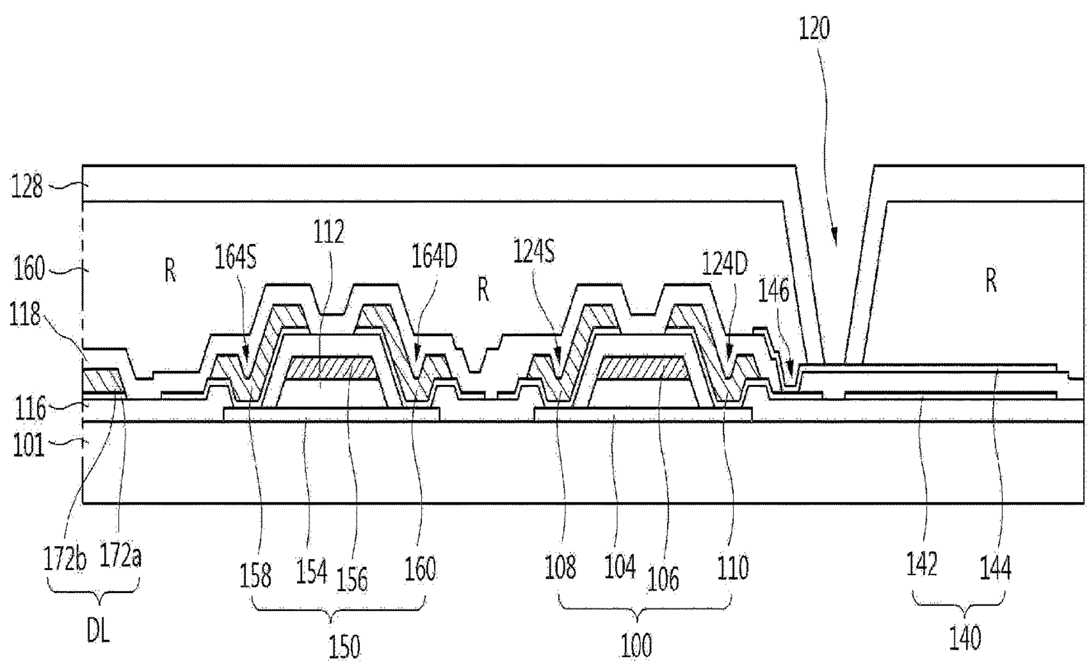

Referring to FIG. 3H, the planarization layer 128 having the pixel contact hole 120 is formed on the substrate 101 where the color filter 160 is formed.

In detail, an organic layer such as an acrylic resin is entirely deposited on the substrate 101 where the color filter 160 is formed, to form the planarization layer 128. Then, the planarization layer 128 is patterned by a photolithography process to form the pixel contact hole 120.

Figure 3I:
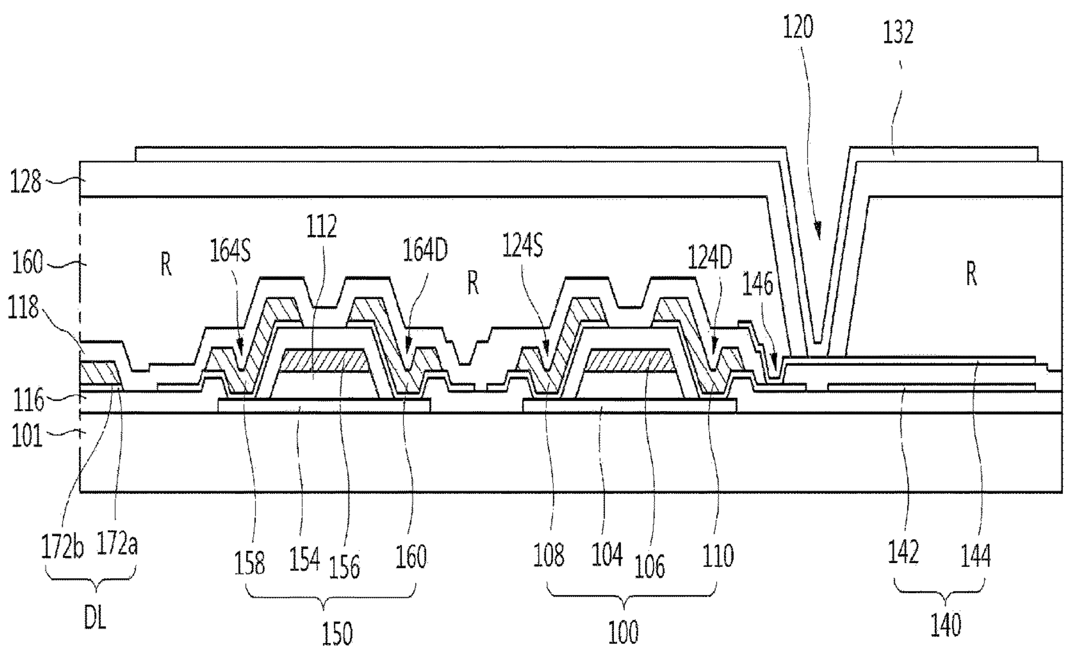

Referring to FIG. 3I, the anode electrode 132 is formed on the planarization layer 128 having the pixel contact hole 120.

In detail, a transparent conductive layer is deposited on the planarization layer 128 having the pixel contact hole 120. Then, the transparent conductive layer is patterned by a photolithography process and an etching process to form the anode electrode 132.

Figure 3J:
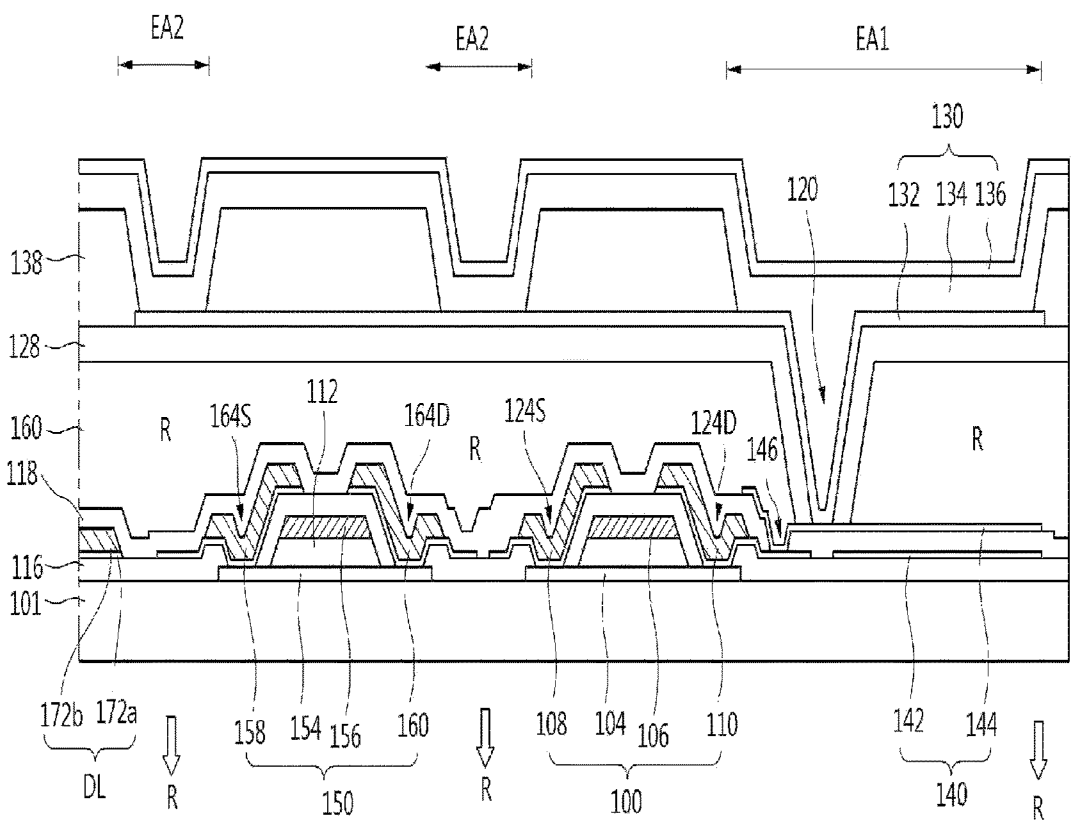

Referring to FIG. 3J, the bank 138, the organic light emitting layer 134, and the cathode electrode are sequentially formed on the substrate 101 where the anode electrode 132 is formed.

In detail, a photoresist layer for the bank 138 is entirely deposited on the substrate 101 where the anode electrode 132 is formed. Subsequently, the photoresist layer for the bank 138 is patterned by a photolithography process to form the bank 138. Then, the organic light emitting layer 134 with white light emission is entirely deposited on the substrate 101 where the bank 138 is formed. The cathode electrode 136 is formed on the substrate 101 where the organic light emitting layer 134 is formed.

According to an embodiment of the present invention, light is emitted from the second light emitting region EA2 where the pixel circuit is disposed as well as the first light emitting region EA1 where the pixel circuit is not disposed such that opening ratio may be improved and thus, it may be easy to realize a high-resolution.

Meanwhile, an embodiment of the present invention discloses that light having the same color is emitted from the first and second areas EA1 and EA2 by way of example. However, light having different colors can also be emitted from the first and second areas EA1 and EA2.

Furthermore, an embodiment of the present invention discloses that areas of the second light emitting regions EA2 are the same at the red, green, and blue sub-pixels. However, the areas of the second light emitting regions EA2 may be different at the red, green, and blue sub-pixels in consideration of durability of the red, green, and blue sub-pixels. Namely, the area of the second light emitting region EA2 of the blue sub-pixel which has lower durability than the red and green sub-pixels may be greater than the areas of the second light emitting regions EA2 of the red and green sub-pixels.

As described above, according to an embodiment of the present invention, light is emitted at the second light emitting region where the pixel circuit is disposed as well as the first light emitting region where the pixel circuit is not disposed, such that opening ratio may be improved and thus, it may be easy to realize a high-resolution.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method of fabricating an organic light emitting display device having a plurality of sub-pixels comprising:

forming a pixel circuit at each sub-pixel region of a substrate;

forming a color filter on the substrate where the pixel circuit is formed;

forming an anode electrode of a light emitting device connected to the pixel circuit;

forming a bank to define a first emitting light area where the pixel circuit is not disposed and a second emitting light area where the pixel circuit is disposed; and forming an organic light emitting layer and a cathode electrode of the light emitting device in the first and second light emitting regions, wherein at least one of electrodes in the pixel circuit includes a transparent conductive layer and an opaque conductive layer on the transparent conductive layer, and the opaque conductive layer of the at least one of electrodes is not provided in the second light emitting region.

2. The method according to claim 1, wherein:

forming the pixel circuit comprises forming a first source electrode and a first drain electrode of a switching thin film transistor and a second source electrode and a second drain electrode of a driving thin film transistor, on the substrate, forming the first source electrode, the first drain electrode, the second source electrode and the second drain electrode comprises:

sequentially forming the transparent conductive layer and an opaque conductive layer on the substrate;

forming a photoresist pattern having a multi-step structure on the opaque conductive layer;

etching the opaque layer and the transparent layer using the photoresist pattern;

ashing the photoresist pattern; and etching the opaque conductive layer disposed at the second light emitting region using the ashed photoresist pattern.

3. The method according to claim 2, wherein:

each of the source electrode and the drain electrode of each of the driving transistor and the switching transistor is disposed to include the transparent conductive layer and the opaque conductive layer, which are stacked at the remaining region except for the second light emitting region in the pixel circuit, and each of the source electrode and the drain electrode of each of the driving transistor and the switching transistor is disposed to include the transparent conductive layer at the first and second light emitting regions.

4. The method according to claim 2, wherein:

each of the source electrode and the drain electrode of each of the driving transistor and the switching transistor is disposed to include the transparent conductive layer and the opaque conductive layer, which are stacked at a region overlapping the active layer, and each of the source electrode and the drain electrode of each of the driving transistor and the switching transistor is disposed to include the transparent conductive layer at a region non-overlapping the active layer.

* * * * *